(12) United States Patent
Iwano

(10) Patent No.: US 11,572,490 B2
(45) Date of Patent: Feb. 7, 2023

(54) POLISHING LIQUID, POLISHING LIQUID SET, AND POLISHING METHOD

(71) Applicant: HITACHI CHEMICAL COMPANY, LTD., Tokyo (JP)

(72) Inventor: Tomohiro Iwano, Tokyo (JP)

(73) Assignee: SHOWA DENKO MATERIALS CO., LTD., Tokyo (JP)

(*) Notice: Subject to any disclaimer, the term of this patent is extended or adjusted under 35 U.S.C. 154(b) by 0 days.

(21) Appl. No.: 16/981,560

(22) PCT Filed: Sep. 25, 2018

(86) PCT No.: PCT/JP2018/035456
§ 371 (c)(1),
(2) Date: Sep. 16, 2020

(87) PCT Pub. No.: WO2019/181013
PCT Pub. Date: Sep. 26, 2019

(65) Prior Publication Data
US 2021/0017422 A1   Jan. 21, 2021

(30) Foreign Application Priority Data

Mar. 22, 2018 (WO) .................. PCT/JP2018/011464
Jul. 26, 2018 (WO) .................. PCT/JP2018/028105

(51) Int. Cl.
C09G 1/02 (2006.01)
B24B 37/04 (2012.01)
C09K 3/14 (2006.01)
H01L 21/3105 (2006.01)

(52) U.S. Cl.
CPC ............. C09G 1/02 (2013.01); B24B 37/044 (2013.01); C09K 3/1409 (2013.01); H01L 21/31053 (2013.01)

(58) Field of Classification Search
CPC ...... C09G 1/02; B24B 37/044; C09K 3/1409; C09K 3/14; H01L 21/31053; H01L 21/30625
See application file for complete search history.

(56) References Cited

U.S. PATENT DOCUMENTS

| | | |
|---|---|---|
| 5,543,126 A | 8/1996 | Ota |
| 6,939,211 B2 | 9/2005 | Taylor |
| 7,112,123 B2 | 9/2006 | Fang |
| 2004/0065022 A1 | 4/2004 | Machii |
| 2004/0152309 A1 | 8/2004 | Carter |
| 2005/0119360 A1 | 6/2005 | Kawakami |
| 2007/0044385 A1 | 3/2007 | Yamada |
| 2011/0275285 A1 | 11/2011 | Satou |
| 2012/0100718 A1 | 4/2012 | Minami |
| 2012/0129346 A1 | 5/2012 | Ryuzaki |
| 2012/0299158 A1 | 11/2012 | Shinoda |
| 2012/0329371 A1 | 12/2012 | Iwano |
| 2013/0161285 A1 | 6/2013 | Li |
| 2015/0140904 A1 | 5/2015 | Iwano |
| 2015/0232704 A1* | 8/2015 | Akutsu ............... C09K 3/1463 252/79.1 |
| 2015/0232705 A1* | 8/2015 | Kachi ................... B24B 37/044 252/79.1 |
| 2016/0024351 A1 | 1/2016 | Yoshida |
| 2016/0108284 A1* | 4/2016 | Yoshizaki ............ C09K 3/1463 252/79.1 |
| 2016/0137881 A1 | 5/2016 | Oota |
| 2016/0319159 A1 | 11/2016 | Minami |
| 2017/0183537 A1 | 6/2017 | Yoon |
| 2017/0183538 A1* | 6/2017 | Kwon ....................... C09G 1/02 |
| 2017/0292039 A1* | 10/2017 | Sato ......................... C09G 1/02 |
| 2018/0043497 A1 | 2/2018 | Hanano |
| 2018/0072917 A1 | 3/2018 | Kobayashi |
| 2019/0211245 A1 | 7/2019 | Choi |
| 2019/0256742 A1 | 8/2019 | Suzuki |
| 2020/0299544 A1* | 9/2020 | Hanano ............. H01L 21/31053 |
| 2021/0189175 A1* | 6/2021 | Gagliardi .............. B24B 37/044 |

FOREIGN PATENT DOCUMENTS

| | | |
|---|---|---|
| CN | 103189457 | 7/2013 |
| CN | 103339219 | 10/2013 |
| CN | 104334675 | 2/2015 |
| CN | 105895518 | 8/2016 |
| CN | 108010878 | 5/2018 |
| JP | H8-022970 A | 1/1996 |
| JP | H10-106994 A | 4/1998 |
| JP | 2005513765 | 5/2005 |
| JP | 2006249129 | 9/2006 |
| JP | 2007-318072 A | 12/2007 |
| JP | 2008112990 | 5/2008 |
| JP | 2009290188 | 12/2009 |
| JP | 2010153781 | 7/2010 |

(Continued)

OTHER PUBLICATIONS

Merricks et al. ("Evolution and Revolution of Cerium Oxide Slurries in CMP", Ferro Electronic Material Systems, 2015.*
International Search Report dated Dec. 11, 2018, for International Application No. PCT/JP2018/035456, together with English language translation.
Written Opinion of the International Searching Authority dated Dec. 11, 2018, for International Application No. PCT/JP2018/035456, together with English language translation.
International Search Report dated Aug. 1, 2019, for International Application No. PCT/JP2018/035441, together with English language translation.

(Continued)

*Primary Examiner* — Thomas T Pham
(74) *Attorney, Agent, or Firm* — Fitch, Even, Tabin & Flannery, L.L.P.

(57) ABSTRACT

A polishing liquid containing abrasive grains, a hydroxy acid, a polyol, and a liquid medium, in which a zeta potential of the abrasive grains is positive, and the hydroxy acid has one carboxyl group and one to three hydroxyl groups.

19 Claims, No Drawings

(56) References Cited

FOREIGN PATENT DOCUMENTS

| | | |
|---|---|---|
| JP | 2011518098 | 6/2011 |
| JP | 4941430 | 5/2012 |
| JP | 2012-186339 A1 | 9/2012 |
| JP | 2013-540851 A | 11/2013 |
| JP | 201593932 | 5/2015 |
| JP | 2015-137297 A | 7/2015 |
| JP | 2016-029123 A | 3/2016 |
| JP | 2016-538359 A | 12/2016 |
| JP | 201752858 | 3/2017 |
| JP | 2017-203076 A | 11/2017 |
| JP | 2018-044046 A | 3/2018 |
| KR | 101737938 | 5/2017 |
| KR | 1020170097090 | 8/2017 |
| KR | 1020180029888 | 3/2018 |
| TW | 201518489 | 5/2015 |
| TW | 201518492 | 5/2015 |
| TW | 201525118 | 7/2015 |
| TW | 201610126 | 3/2016 |
| TW | 201816060 | 5/2018 |
| WO | 97029510 | 8/1997 |
| WO | 02067309 | 8/2002 |
| WO | 2008146641 | 12/2008 |
| WO | 2009131133 | 10/2009 |
| WO | 2010143579 | 12/2010 |
| WO | 2012070541 | 5/2012 |
| WO | 2012070542 | 5/2012 |
| WO | 2012070544 | 5/2012 |
| WO | 2013125441 | 8/2013 |
| WO | 2014/208414 A1 | 12/2014 |
| WO | 2014199739 | 12/2014 |
| WO | 2015/052988 A1 | 4/2015 |
| WO | 2015/098197 A1 | 7/2015 |
| WO | 2016/006553 A1 | 1/2016 |
| WO | 2016143797 | 9/2016 |
| WO | 201743139 | 3/2017 |
| WO | 2018012174 | 1/2018 |
| WO | 2018048068 | 3/2018 |

OTHER PUBLICATIONS

Written Opinion of the International Searching Authority dated Aug. 1, 2019, for International Application No. PCT/JP2018/035441, together with English language translation.

International Search Report dated Dec. 25, 2018, for International Application No. PCT/JP2018/035443, together with English language translation.

Written Opinion of the International Searching Authority dated Dec. 25, 2018, for International Application No. PCT/JP2018/035443, together with English language translation.

International Search Report dated Aug. 1, 2019, for International Application No. PCT/JP2018/035463, together with English language translation.

Written Opinion of the International Searching Authority dated Aug. 1, 2019, for International Application No. PCT/JP2018/035463, together with English language translation.

International Search Report dated Sep. 24, 2019, for International Application No. PCT/JP2019/028712, together with English language translation.

Written Opinion of the International Searching Authority dated Sep. 27, 2019, for International Application No. PCT/JP2019/028712, together with English language translation.

"Wikipedia, "Tartaric acid" via https://en.wikipedia.org/wiki/Tartaric_acid", 2021, p. 1-p. 9 (cited in Office Action dated Mar. 9, 2021 in U.S. Appl. No. 16/981,589).

"Wikipedia, "Polyethylene glycol" via https://en.wikipedia.org/wiki/Polyethylene_glycol", 2021, p. 1-p. 11 (cited in Office Action dated Mar. 9, 2021 in U.S. Appl. No. 16/981,589).

"Wikipedia, "Poly(N-vinylacetamide)" via https://en.wikipedia.org/wiki/Poly(N-vinylacetamide)", 2019, p. 1-p. 2 (cited in Office Action dated Mar. 9, 2021 in U.S. Appl. No. 16/981,589).

"Wikipedia, "N-vinylpyrrolidone" via https://en.wikipedia.org/wiki/N-Vinylpyrrolidone", 2020, p. 1-p. 3 (cited in Office Action dated Mar. 9, 2021 in U.S. Appl. No. 16/981,589).

"Glyceric acid," https://en.wikipedia.org/wiki/Glyceric_acid, 2021, p. 1-p. 2 (Cited in Office Action dated May 10, 2021 in U.S. Appl. No. 16/981,589).

"Glycolic Acid," https://en.wikipedia.org/wiki/Glycolic_acid, 2021, p. 1-p. 5 (Cited in Office Action dated May 10, 2021 in U.S. Appl. No. 16/981,589).

"Lactic acid," https://en.wikipedia.org/wiki/Lactic_acid, 2021, p. 1-p. 11 (Cited in Office Action dated May 10, 2021 in U.S. Appl. No. 16/981,589).

Merrian Webster, Definition of "have," https://www.merriam-webster.com/dictionary/have, 2021, p. 1-p. 14 (Cited in Office Action dated May 10, 2021 in U.S. Appl. No. 16/981,589).

A. Solt, "13.1 Amino Acids," Chemistry Libre Texts, Chem.Libretext.org, 2021 (Cited in Office Action dated May 25, 2021 in U.S. Appl. No. 16/981,573).

* cited by examiner

POLISHING LIQUID, POLISHING LIQUID SET, AND POLISHING METHOD

CROSS-REFERENCE TO RELATED APPLICATIONS

This application is a U.S. national phase application filed under 35 U.S.C. § 371 of International Application No. PCT/JP2018/035456, filed Sep. 25, 2018, designating the United States, which claims priority from International Application No. PCT/JP2018/011464, filed Mar. 22, 2018, which are hereby incorporated herein by reference in their entirety.

TECHNICAL FIELD

The present invention relates to a polishing liquid, a polishing liquid set, and a polishing method. In particular, the present invention relates to a polishing liquid, a polishing liquid set, and a polishing method which can be used in a flattening step of a base substrate surface, that is a manufacturing technique for a semiconductor element. More specifically, the present invention relates to a polishing liquid, a polishing liquid set, and a polishing method which can be used in a flattening step of a shallow trench isolation (hereinafter, referred to as "STI") insulating material, a pre-metal insulating material, an interlayer insulating material, or the like.

BACKGROUND ART

In recent years, processing techniques for increasing density and miniaturization are becoming ever more important in manufacturing steps for semiconductor elements. CMP (chemical mechanical polishing) technique that is one of processing techniques has become an essential technique in manufacturing steps for semiconductor elements, for STI formation, flattening of pre-metal insulating materials or interlayer insulating materials, formation of plugs or embedded metal wirings, or the like.

As a polishing liquid most frequently used, for example, a silica-based polishing liquid containing silica (silicon oxide) particles such as fumed silica or colloidal silica as abrasive grains is exemplified. The silica-based polishing liquid is characterized by being high in general versatility, and can polish broad types of materials irrespective of insulating materials and conductive materials by appropriately selecting an abrasive grain content, a pH, an additive, or the like.

Meanwhile, as a polishing liquid mainly used for insulating materials such as silicon oxide, a demand for a polishing liquid containing cerium compound particles as abrasive grains is also increasing. For example, a ceria-based polishing liquid containing ceria (cerium oxide) particles as abrasive grains can polish silicon oxide at a high rate even when the abrasive grain content is lower than that in the silica-based polishing liquid (for example, see Patent Literatures 1 and 2 described below).

CITATION LIST

Patent Literature

Patent Literature 1: Japanese Unexamined Patent Publication No. H10-106994
Patent Literature 2: Japanese Unexamined Patent Publication No. H08-022970

SUMMARY OF INVENTION

Technical Problem

Incidentally, when a polishing liquid containing abrasive grains is stored for a certain period of time, if the state of the abrasive grains is changed due to the aggregation of the abrasive grains, or the like, there is a case where the polishing rate obtained by using this polishing liquid is decreased. Therefore, with respect to the polishing liquid containing abrasive grains, the dispersion stability of the abrasive grains is required to be improved.

The present invention is made to solve the above-described problems, and an object thereof is to provide a polishing liquid having excellent dispersion stability of abrasive grains. Another object of the present invention is to provide a polishing liquid set for obtaining the above-described polishing liquid. Still another object of the present invention is to provide a polishing method which uses the above-described polishing liquid or the above-described polishing liquid set.

Solution to Problem

The present inventors have found that, although polishing characteristics such as a polishing rate for an insulating material can be improved by using a polishing liquid containing a polyol, there is a case where abrasive grains aggregate in the polishing liquid. On the other hand, the present inventors have found that, by concurrently using abrasive grains having a positive zeta potential (cationic abrasive grains), a specific hydroxy acid, and a polyol, the dispersion stability of the abrasive grains in the polishing liquid containing a polyol can be improved.

A polishing liquid of the present invention contains abrasive grains, a hydroxy acid, a polyol, and a liquid medium, in which a zeta potential of the abrasive grains is positive, and the hydroxy acid has one carboxyl group and one to three hydroxyl groups.

The polishing liquid of the present invention has excellent dispersion stability of the abrasive grains. According to the polishing liquid like this, a decrease in polishing rate can be suppressed even in a case where the polishing liquid is stored for a certain period of time.

The hydroxy acid may contain a compound having one carboxyl group and one hydroxyl group, and may contain a compound having one carboxyl group and two hydroxyl groups.

The polyol preferably contains polyether polyol.

A content of the hydroxy acid is preferably 0.01 to 1.0% by mass.

A content of the polyol is preferably 0.05 to 5.0% by mass.

An aspect of the present invention relates to use of the polishing liquid in polishing of a surface to be polished containing silicon oxide. That is, the polishing liquid of the present invention is preferably used for polishing a surface to be polished containing silicon oxide.

A polishing liquid set of the present invention contains constituent components of the polishing liquid separately stored as a first liquid and a second liquid, in which the first liquid contains the abrasive grains and a liquid medium, and the second liquid contains the hydroxy acid, the polyol, and a liquid medium. According to the polishing liquid set of the present invention, the same effect as that of the polishing liquid of the present invention can be obtained.

A polishing method of the present invention may include a step of polishing a surface to be polished by using the above-described polishing liquid or a step of polishing a surface to be polished by using a polishing liquid obtained by mixing the first liquid and the second liquid of the above-described polishing liquid set. According to these polishing methods, by using the above-described polishing liquid or the above-described polishing liquid set, the same effect as that of the polishing liquid of the present invention can be obtained.

An aspect of a polishing method of the present invention is a polishing method for a base substrate having an insulating material and silicon nitride, and may include a step of selectively polishing an insulating material with respect to silicon nitride by using the above-described polishing liquid or a step of selectively polishing an insulating material with respect to silicon nitride by using a polishing liquid obtained by mixing the first liquid and the second liquid of the above-described polishing liquid set. According to these polishing methods, by using the above-described polishing liquid or the above-described polishing liquid set, in the case of selectively polishing the insulating material with respect to the silicon nitride, the same effect as that of the polishing liquid of the present invention can be obtained.

Another aspect of a polishing method of the present invention is a polishing method for a base substrate having an insulating material and polysilicon, and may include a step of selectively polishing an insulating material with respect to polysilicon by using the above-described polishing liquid or a step of selectively polishing an insulating material with respect to polysilicon by using a polishing liquid obtained by mixing the first liquid and the second liquid of the above-described polishing liquid set. According to these polishing methods, by using the above-described polishing liquid or the above-described polishing liquid set, in the case of selectively polishing the insulating material with respect to the polysilicon, the same effect as that of the polishing liquid of the present invention can be obtained.

Advantageous Effects of Invention

According to the present invention, it is possible to provide a polishing liquid having excellent dispersion stability of abrasive grains. According to the present invention, it is possible to provide a polishing liquid set for obtaining the above-described polishing liquid. According to the present invention, it is possible to provide a polishing method which uses the above-described polishing liquid or the above-described polishing liquid set.

According to the present invention, it is possible to provide use of a polishing liquid or a polishing liquid set in a flattening step of a base substrate surface. According to the present invention, it is possible to provide use of a polishing liquid or a polishing liquid set in a flattening step of STI insulating materials, pre-metal insulating materials, or interlayer insulating materials. According to the present invention, it is possible to provide use of a polishing liquid or a polishing liquid set in a polishing step of selectively polishing an insulating material with respect to a stopper material.

DESCRIPTION OF EMBODIMENTS

Hereinafter, a polishing liquid, a polishing liquid set, and a polishing method using these of embodiments of the present invention will be described in detail.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specified. In the present specification, when a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

In the present specification, the term "polishing liquid" (abrasive) is defined as a composition to be brought into contact with a surface to be polished, at the time of polishing. The term "polishing liquid" itself does not limit any components contained in the polishing liquid. As described later, a polishing liquid of the present embodiment contains abrasive grains. While the abrasive grains are also referred to as "polishing particles" (abrasive particle), it is referred to as "abrasive grains" in the present specification. The abrasive grains are generally solid particles, and it is considered that a subject to be removed is removed by a mechanical action of the abrasive grains and a chemical action of the abrasive grains (mainly surfaces of the abrasive grains) at the time of polishing, but the mechanism is not limited thereto.

<Polishing Liquid>

The polishing liquid of the present embodiment is a polishing liquid for CMP, for example. The polishing liquid of the present embodiment contains abrasive grains, a hydroxy acid, a polyol, and a liquid medium, in which a zeta potential of the abrasive grains is positive, and the hydroxy acid has one carboxyl group and one to three hydroxyl groups. The polishing liquid of the present embodiment has excellent dispersion stability of the abrasive grains. According to the polishing liquid of the present embodiment, a decrease in polishing rate can be suppressed even in a case where the polishing liquid is stored for a certain period of time (for example, 168 hours or longer). Furthermore, according to the polishing liquid of the present embodiment, while a high polishing rate is obtained immediately after preparation of the polishing liquid, a decrease in polishing rate can be suppressed even in a case where the polishing liquid is stored for a certain period of time (for example, 168 hours or longer).

The reasons why the effect of obtaining excellent dispersion stability of the abrasive grains is exhibited are not necessarily clearly known; however, the present inventors speculate the reasons to be as follows.

That is, $COO^-$ generated by proton $(H^+)$ isolating from the carboxyl group of the hydroxy acid can be adsorbed to the abrasive grains having a positive zeta potential. In the case of using a hydroxy acid having two or more carboxyl groups, the abrasive grains are likely to be bonded to each other through COO⁻ adsorbed to the abrasive grains, and thereby the abrasive grains aggregate. On the other hand, when the number of carboxyl group of the hydroxy acid in the polishing liquid containing a polyol is kept to one, the abrasive grains are less likely to be bonded to each other through COO⁻, and thereby the aggregation of the abrasive grains is easily suppressed.

Furthermore, hydroxy acids can be bonded to each other through hydroxyl group. Therefore, when the number of hydroxyl groups of the hydroxy acid increases, the abrasive grains are likely to aggregate through the hydroxyl group of the hydroxy acid adsorbed to the abrasive grains. On the other hand, when the number of hydroxyl groups of the hydroxy acid in the polishing liquid containing a polyol is kept to one to three, the abrasive grains are less likely to be bonded to each other through the hydroxyl group of the hydroxy acid, and thereby the aggregation of the abrasive grains is easily suppressed.

According to these actions, in the polishing liquid of the present embodiment, excellent dispersion stability of the abrasive grains can be achieved.

(Abrasive Grains)

The polishing liquid of the present embodiment contains abrasive grains having a positive zeta potential in the polishing liquid as cationic abrasive grains. The abrasive grains preferably contain at least one selected from the group consisting of ceria, silica, alumina, zirconia, yttria, and a hydroxide of a tetravalent metal element and more preferably contain ceria, from the viewpoint of polishing an insulating material at a high polishing rate. The abrasive grains can be used singly or in combinations of two or more.

The "hydroxide of a tetravalent metal element" is a compound containing a tetravalent metal ($M^{4+}$) and at least one hydroxide ion ($OH^-$). The hydroxide of a tetravalent metal element may contain an anion (for example, nitrate ion $NO_3^-$ and a sulfate ion $SO_4^{2-}$) other than a hydroxide ion. For example, the hydroxide of a tetravalent metal element may contain an anion (for example, a nitrate ion $NO_3^-$ and a sulfate ion $SO_4^{2-}$) bound to the tetravalent metal element. The hydroxide of a tetravalent metal element can be prepared by reacting a salt of a tetravalent metal element (metal salt) with an alkali source (base).

The hydroxide of a tetravalent metal element preferably contains cerium hydroxide (hydroxide of tetravalent cerium) from the viewpoint of further improving the polishing rate for an insulating material. The cerium hydroxide can be prepared by reacting a cerium salt with an alkali source (base). The cerium hydroxide is preferably prepared by mixing a cerium salt with an alkali liquid (for example, alkali aqueous solution). This makes it possible to obtain particles having an extremely fine particle diameter, and easily obtain an excellent effect of reducing polishing scratches. The cerium hydroxide can be obtained by mixing a cerium salt solution (for example, cerium salt aqueous solution) with alkali liquid. Examples of cerium salt include $Ce(NO_3)_4$, $Ce(SO_4)_2$, $Ce(NH_4)_2(NO_3)_6$, and $Ce(NH_4)_4(SO_4)_4$.

It is considered that particles including $Ce(OH)_aX_b$ (in the formula, a+bxc=4) made of tetravalent cerium ($Ce^{4+}$), one to three hydroxide ions ($OH^-$), and one to three anions ($X^{c-}$) are generated (incidentally, such particles are also "cerium hydroxide") depending on production conditions of cerium hydroxide and the like. It is considered that, in $Ce(OH)_aX_b$, an electron-withdrawing anion ($X^{c-}$) acts to enhance reactivity of the hydroxide ion and the polishing rate is improved with the increase in abundance of $Ce(OH)_aX_b$. Examples of the anions ($X^{c-}$) include $NO_3^-$ and $SO_4^{2-}$. It is considered that the particles containing cerium hydroxide can contain not only $Ce(OH)_aX_b$ but also $Ce(OH)_4$, $CeO_2$, or the like.

The containing of $Ce(OH)_aX_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by XPS method (X-ray Photoelectron Spectroscopy).

In a case where the abrasive grains contain ceria, the lower limit of the content of ceria is preferably 50% by mass or more, more preferably more than 50% by mass, further preferably 60% by mass or more, particularly preferably 70% by mass or more, extremely preferably 80% by mass or more, highly preferably 90% by mass or more, even more preferably 95% by mass or more, more preferably 98% by mass or more, and further preferably 99% by mass or more, on the basis of the whole abrasive grains (the whole abrasive grains contained in the polishing liquid; the same applies hereinafter), from the viewpoint of further improving the polishing rate for an insulating material. These numerical ranges may be satisfied in an embodiment where the abrasive grains do not contain composite particles described later.

The lower limit of the average particle diameter of the abrasive grains in the polishing liquid or a slurry of the polishing liquid set described later is preferably 16 nm or more, more preferably 20 nm or more, further preferably 30 nm or more, particularly preferably 40 nm or more, extremely preferably 50 nm or more, highly preferably 100 nm or more, even more preferably 120 nm or more, more preferably 150 nm or more, further preferably 200 nm or more, particularly preferably 250 nm or more, and extremely preferably 300 nm or more, from the viewpoint of further improving the polishing rate for an insulating material. The upper limit of the average particle diameter of the abrasive grains is preferably 1050 nm or less, more preferably 1000 nm or less, further preferably 800 nm or less, particularly preferably 600 nm or less, extremely preferably 500 nm or less, and highly preferably 400 nm or less, from the viewpoint of further suppressing scratches on a polished surface. From these viewpoints, the average particle diameter of the abrasive grains is more preferably 16 to 1050 nm and further preferably 20 to 1000 nm.

The "average particle diameter" of the abrasive grains means an average secondary particle diameter of the abrasive grains. For example, the average particle diameter of the abrasive grains is the volume average particle diameter, and it can be measured, for the polishing liquid or the slurry of the polishing liquid set described later, using an optical diffraction scattering particle size distribution meter (for example, trade name: Microtrac MT3300EXII manufactured by MicrotracBEL Corp.).

The zeta potential (surface potential) of the abrasive grains in the polishing liquid is positive (the zeta potential exceeds 0 mV) from the viewpoint of obtaining excellent dispersion stability of the abrasive grains. The lower limit of the zeta potential of the abrasive grains is preferably 10 mV or more, more preferably 20 mV or more, further preferably 25 mV or more, particularly preferably 30 mV or more, extremely preferably 40 mV or more, and highly preferably 50 mV or more, from the viewpoint of easily obtaining excellent dispersion stability of the abrasive grains. The upper limit of the zeta potential of the abrasive grains is not particularly limited, but is preferably 200 mV or less. From these viewpoints, the zeta potential of the abrasive grains is more preferably 10 to 200 mV.

The zeta potential of the abrasive grains can be measured, for example, by using a dynamic light scattering type zeta potential measurement apparatus (for example, trade name: DelsaNano C manufactured by Beckman Coulter, Inc.). The zeta potential of the abrasive grains can be adjusted using an additive. For example, by bringing a monocarboxylic acid (acetic acid or the like) into contact with abrasive grains containing ceria, abrasive grains having a positive zeta potential can be obtained. Also, by bringing ammonium dihydrogen phosphate, a material having carboxyl group (polyacrylic acid or the like) or the like into contact with abrasive grains containing ceria, abrasive grains having a negative zeta potential can be obtained.

The lower limit of the content of the abrasive grains is preferably 0.005% by mass or more, more preferably 0.01% by mass or more, further preferably 0.02% by mass or more, particularly preferably 0.03% by mass or more, extremely preferably 0.04% by mass or more, highly preferably 0.05% by mass or more, even more preferably 0.1% by mass or more, and more preferably 0.15% by mass or more, on the basis of the total mass of the polishing liquid, from the viewpoint of further improving the polishing rate for an insulating material. The upper limit of the content of the abrasive grains is preferably 20% by mass or less, more preferably 15% by mass or less, further preferably 10% by mass or less, particularly preferably 5% by mass or less, extremely preferably 4% by mass or less, highly preferably 3% by mass or less, even more preferably 1% by mass or less, more preferably 0.5% by mass or less, further preferably 0.3% by mass or less, and particularly preferably 0.2% by mass or less, on the basis of the total mass of the polishing liquid, from the viewpoint of easily obtaining excellent dispersion stability of the abrasive grains. From these viewpoints, the content of the abrasive grains is more preferably 0.005 to 20% by mass on the basis of the total mass of the polishing liquid.

The abrasive grains may include composite particles composed of a plurality of particles in contact with each other. For example, the abrasive grains may include composite particles including first particles and second particles in contact with the first particles or may include composite particles and free particles (for example, second particles not in contact with first particles).

The abrasive grains are preferably an embodiment including first particles and second particles in contact with the first particles, in which the first particles contain ceria and the second particles contain a cerium compound, as an embodiment including composite particles. By using such abrasive grains, excellent dispersion stability of the abrasive grains is easily obtained. The reasons why such an effect is obtained are, for example, the reasons to be as follows. However, the reasons are not limited to the reasons to be as follows.

That is, when the second particles are in contact with the first particles, irregularities are generated on the surfaces of the particles, and thereby a contact area when the composite particles are in contact with each other is decreased. As a result, excessive aggregation of the composite particles is suppressed, and thereby dispersion stability is easily improved. Furthermore, when the first particles contain ceria and the second particles contain a cerium compound, this phenomenon is likely to occur, and thereby dispersion stability is easy to be further improved.

Examples of the cerium compound of the second particles include cerium hydroxide and ceria. As the cerium compound of the second particles, a compound different from ceria can be used. The cerium compound preferably contains cerium hydroxide from the viewpoint of easily obtaining excellent dispersion stability of the abrasive grains.

The particle diameter of the second particles is preferably smaller than the particle diameter of the first particles. The magnitude relationship in particle diameter between the first particles and the second particles can be determined from SEM images of the composite particle, or the like. In general, particles having a small particle diameter have a larger surface area per unit mass than that of particles having a large particle diameter, and thus have higher reaction activity. For this reason, since the reaction activity of the second particles having a smaller particle diameter than the particle diameter of the first particles is high, the second particles rapidly interact with the first particles to easily cover the first particles when the second particles are in contact with the first particles.

The lower limit of the particle diameter of the first particles is preferably 15 nm or more, more preferably 25 nm or more, further preferably 35 nm or more, particularly preferably 40 nm or more, extremely preferably 50 nm or more, highly preferably 80 nm or more, and even more preferably 100 nm or more, from the viewpoint of further improving the polishing rate for an insulating material. The upper limit of the particle diameter of the first particles is preferably 1000 nm or less, more preferably 800 nm or less, further preferably 600 nm or less, particularly preferably 400 nm or less, extremely preferably 300 nm or less, highly preferably 200 nm or less, and even more preferably 150 nm or less, from the viewpoint of improving the dispersibility of the abrasive grains and the viewpoint of easily suppressing scratches at a polished surface. From the above-described viewpoints, the particle diameter of the first particles is more preferably 15 to 1000 nm. The average particle diameter (average secondary particle diameter) of the first particles may be in the above ranges.

The lower limit of the particle diameter of the second particles is preferably 1 nm or more, more preferably 2 nm or more, and further preferably 3 nm or more, from the viewpoint of further improving the polishing rate for an insulating material. The upper limit of the particle diameter of the second particles is preferably 50 nm or less, more preferably 30 nm or less, further preferably 25 nm or less, particularly preferably 20 nm or less, extremely preferably 15 nm or less, and highly preferably 10 nm or less, from the viewpoint of improving the dispersibility of the abrasive grains and the viewpoint of easily suppressing scratches at a polished surface. From the above-described viewpoints, the particle diameter of the second particles is more preferably 1 to 50 nm. The average particle diameter (average secondary particle diameter) of the second particles may be in the above ranges.

The first particles can have a negative zeta potential. The second particles can have a positive zeta potential.

The composite particles including the first particles and the second particles can be obtained, for example, by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like.

The lower limit of the content of the ceria in the first particles is preferably 50% by mass or more, more preferably 70% by mass or more, further preferably 90% by mass or more, and particularly preferably 95% by mass or more, on the basis of the whole first particles (the whole first particles contained in the polishing liquid; the same applies hereinafter), from the viewpoint of further improving the polishing rate for an insulating material. The first particles may be an embodiment substantially composed of ceria (an embodiment in which 100% by mass of the first particles are substantially ceria).

The lower limit of the content of the cerium compound in the second particles is preferably 50% by mass or more, more preferably 70% by mass or more, further preferably 90% by mass or more, and particularly preferably 95% by mass or more, on the basis of the whole second particles (the whole second particles contained in the polishing liquid; the same applies hereinafter), from the viewpoint of further improving the polishing rate for an insulating material. The second particles may be an embodiment substantially composed of a cerium compound (an embodiment in which 100% by mass of the second particles are substantially a cerium compound).

The content of the second particles can be estimated on the basis of a value of absorbance of equation below which is obtained by a spectrophotometer when light having a specific wavelength is transmitted through the polishing liquid. That is, in a case where particles absorb light having a specific wavelength, the light transmittance of a region containing the particles is decreased. The light transmittance is decreased not only by absorption of the particles but also by scattering, but in the second particles, the influence of scattering is small. Therefore, in present embodiment, the content of the second particles can be estimated on the basis of a value of absorbance calculated by equation below.

$$\text{Absorbance} = -\text{LOG}_{10}(\text{Light transmittance}[\%]/100)$$

The content of the first particles in the abrasive grains including composite particles is preferably in the following range on the basis of the whole abrasive grains. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of further improving the polishing rate for an insulating material. The upper limit of the content of the first particles is preferably 95% by mass or less, more preferably 93% by mass or less, and further preferably 91% by mass or less, from the viewpoint of further improving the polishing rate for an insulating material. From the above-described viewpoints, the content of the first particles is more preferably 50 to 95% by mass.

The content of the second particles in the abrasive grains including composite particles is preferably in the following range on the basis of the whole abrasive grains. The lower limit of the content of the second particles is preferably 5% by mass or more, more preferably 7% by mass or more, and further preferably 9% by mass or more, from the viewpoint of further improving the polishing rate for an insulating material. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of further improving the polishing rate for an insulating material. From the above-described viewpoints, the content of the second particles is more preferably 5 to 50% by mass.

The content of the ceria in the abrasive grains including composite particles is preferably in the following range on the basis of the whole abrasive grains. The lower limit of the content of the ceria is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of further improving the polishing rate for an insulating material. The upper limit of the content of the ceria is preferably 95% by mass or less, more preferably 93% by mass or less, and further preferably 91% by mass or less, from the viewpoint of further improving the polishing rate for an insulating material. From the above-described viewpoints, the content of the ceria is more preferably 50 to 95% by mass.

The content of the cerium hydroxide in the abrasive grains including composite particles is preferably in the following range on the basis of the whole abrasive grains. The lower limit of the content of the cerium hydroxide is preferably 5% by mass or more, more preferably 7% by mass or more, and further preferably 9% by mass or more, from the viewpoint of further improving the polishing rate for an insulating material. The upper limit of the content of the cerium hydroxide is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of further improving the polishing rate for an insulating material. From the above-described viewpoints, the content of the cerium hydroxide is more preferably 5 to 50% by mass.

The content of the first particles is preferably in the following range on the basis of the total amount of the first particles and the second particles. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of further improving the polishing rate for an insulating material. The upper limit of the content of the first particles is preferably 95% by mass or less, more preferably 93% by mass or less, and further preferably 91% by mass or less, from the viewpoint of further improving the polishing rate for an insulating material. From the above-described viewpoints, the content of the first particles is more preferably 50 to 95% by mass.

The content of the second particles is preferably in the following range on the basis of the total amount of the first particles and the second particles. The lower limit of the content of the second particles is preferably 5% by mass or more, more preferably 7% by mass or more, and further preferably 9% by mass or more, from the viewpoint of further improving the polishing rate for an insulating material. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of further improving the polishing rate for an insulating material. From the above-described viewpoints, the content of the second particles is more preferably 5 to 50% by mass.

The content of the first particles in the polishing liquid is preferably in the following range on the basis of the total mass of the polishing liquid. The lower limit of the content of the first particles is preferably 0.005% by mass or more, more preferably 0.008% by mass or more, further preferably 0.01% by mass or more, particularly preferably 0.05% by mass or more, extremely preferably 0.08% by mass or more, highly preferably 0.1% by mass or more, and even more preferably 0.15% by mass or more, from the viewpoint of further improving the polishing rate for an insulating material. The upper limit of the content of the first particles is preferably 5% by mass or less, more preferably 3% by mass or less, further preferably 1% by mass or less, particularly preferably 0.5% by mass or less, extremely preferably 0.3% by mass or less, and highly preferably 0.2% by mass or less, from the viewpoint of enhancing the storage stability of the polishing liquid. From the above-described viewpoints, the content of the first particles is more preferably 0.005 to 5% by mass.

The content of the second particles in the polishing liquid is preferably in the following range on the basis of the total mass of the polishing liquid. The lower limit of the content of the second particles is preferably 0.005% by mass or more, more preferably 0.008% by mass or more, further preferably 0.01% by mass or more, particularly preferably 0.012% by mass or more, extremely preferably 0.015% by mass or more, and highly preferably 0.016% by mass or more, from the viewpoints of further improving the chemical interaction between the abrasive grains and a surface to be polished and further improving the polishing rate for an insulating material. The upper limit of the content of the second particles is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, more preferably 0.035% by mass or less, further preferably 0.03% by mass or less, particularly preferably 0.025% by mass or less, and extremely preferably 0.03% by mass or less, from the viewpoints of easily avoiding the aggregation of the abrasive grains, and easily obtaining more favorable chemical interaction between the abrasive grains and a surface to be polished to easily utilize the properties of the abrasive grains effectively. From the above-described viewpoints, the content of the second particles is more preferably 0.005 to 5% by mass.

The content of the ceria in the polishing liquid containing abrasive grains including composite particles is preferably in the following range on the basis of the total mass of the polishing liquid. The lower limit of the content of the ceria is preferably 0.005% by mass or more, more preferably 0.008% by mass or more, further preferably 0.01% by mass or more, particularly preferably 0.05% by mass or more, extremely preferably 0.08% by mass or more, highly preferably 0.1% by mass or more, and even more preferably 0.15% by mass or more, from the viewpoint of further improving the polishing rate for an insulating material. The upper limit of the content of the ceria is preferably 5% by mass or less, more preferably 3% by mass or less, further preferably 1% by mass or less, particularly preferably 0.5% by mass or less, extremely preferably 0.3% by mass or less, and highly preferably 0.2% by mass or less, from the viewpoint of enhancing the storage stability of the polishing liquid. From the above-described viewpoints, the content of the ceria is more preferably 0.005 to 5% by mass.

The content of the cerium hydroxide in the polishing liquid containing abrasive grains including composite particles is preferably in the following range on the basis of the total mass of the polishing liquid. The lower limit of the content of the cerium hydroxide is preferably 0.005% by mass or more, more preferably 0.008% by mass or more, further preferably 0.01% by mass or more, particularly preferably 0.012% by mass or more, extremely preferably 0.015% by mass or more, and highly preferably 0.016% by mass or more, from the viewpoints of further improving the chemical interaction between the abrasive grains and a surface to be polished and further improving the polishing rate for an insulating material. The upper limit of the content of the cerium hydroxide is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, more preferably 0.035% by mass or less, further preferably 0.03% by mass or less, particularly preferably 0.025% by mass or less, and extremely preferably 0.03% by mass or less, from the viewpoints of easily avoiding the aggregation of the abrasive grains, and easily obtaining more favorable chemical interaction between the abrasive grains and a surface to be polished to easily utilize the properties of the abrasive grains effectively. From the above-described viewpoints, the content of the cerium hydroxide is more preferably 0.005 to 5% by mass.

The content of the abrasive grains in the polishing liquid containing abrasive grains including composite particles is preferably in the following range on the basis of the total mass of the polishing liquid. The lower limit of the content of the abrasive grains is preferably 0.01% by mass or more, more preferably 0.05% by mass or more, further preferably 0.1% by mass or more, particularly preferably 0.12% by mass or more, extremely preferably 0.16% by mass or more, and highly preferably 0.18% by mass or more, from the viewpoint of further improving the polishing rate for an insulating material. The upper limit of the content of the abrasive grains is preferably 10% by mass or less, more preferably 5% by mass or less, further preferably 1% by mass or less, particularly preferably 0.5% by mass or less, extremely preferably 0.1% by mass or less, and highly preferably 0.2% by mass or less, from the viewpoint of enhancing the storage stability of the polishing liquid. From the above-described viewpoints, the content of the abrasive grains is more preferably 0.01 to 10% by mass.

(Additive)

The polishing liquid of the present embodiment contains an additive. Here, "additive" refers to a substance that is contained in the polishing liquid in addition to the abrasive grains and a liquid medium. When the additive is used, for example, it is possible to adjust the polishing properties such as polishing rate and polishing selectivity; polishing liquid properties such as dispersibility of the abrasive grains and storage stability; and the like.

[Hydroxy Acid]

The polishing liquid of the present embodiment contains, as an essential additive, a hydroxy acid having one carboxyl group and one to three hydroxyl groups (hereinafter, referred to as "specific hydroxy acid"). In the specific hydroxy acid, the number of carboxyl group is one and the number of hydroxyl groups is one to three. Incidentally, "—OH" in carboxyl group is not included in the "hydroxyl group". The "hydroxyl group" may be either an alcoholic hydroxyl group or a phenolic hydroxyl group. The specific hydroxy acid may not have a phenolic hydroxyl group. The specific hydroxy acid may have one carboxyl group and one to three alcoholic hydroxyl groups.

The specific hydroxy acid may contain a compound having one carboxyl group and one hydroxyl group, may contain a compound having one carboxyl group and two hydroxyl groups, or may contain a compound having one carboxyl group and three hydroxyl groups. The specific hydroxy acid can be used singly or in combination of two or more kinds thereof. The number of hydroxyl groups in the specific hydroxy acid is preferably one or two and more preferably two, from the viewpoint of easily obtaining excellent dispersion stability of the abrasive grains.

Examples of the specific hydroxy acid include glycolic acid, glyceric acid, lactic acid (for example, DL-lactic acid), 2,2-bis(hydroxymethyl)propionic acid, 2,2-bis(hydroxymethyl)butyric acid, N,N-bis(2-hydroxyethyl)glycine, N-[2-hydroxy-1,1-bis(hydroxymethyl) ethyl] glycine, bicin, tricine, tyrosine, serine, and threonine. The specific hydroxy acid preferably contains at least one selected from the group consisting of lactic acid (for example, DL-lactic acid), 2,2-bis(hydroxymethyl)propionic acid, 2,2-bis(hydroxymethyl)butyric acid, N,N-bis(2-hydroxyethyl)glycine, and N-[2-hydroxy-1,1-bis(hydroxymethyl)ethyl]glycine, from the viewpoint of easily obtaining excellent dispersion stability of the abrasive grains.

The specific hydroxy acid preferably contains an aliphatic hydroxy acid from the viewpoint of easily obtaining excellent dispersion stability of the abrasive grains. The specific hydroxy acid may contain a hydroxy acid containing a nitrogen atom or may contain a hydroxy acid not containing a nitrogen atom. The specific hydroxy acid may have an amino group or may not have an amino group. The specific hydroxy acid may contain an amino acid or may not contain an amino acid.

The upper limit of the hydroxyl value of the specific hydroxy acid is preferably 1500 or less, more preferably 1300 or less, further preferably 1100 or less, particularly preferably 1000 or less, and extremely preferably 900 or less, from the viewpoint of easily obtaining excellent dispersion stability of the abrasive grains. The lower limit of the hydroxyl value of the specific hydroxy acid is preferably 50 or more, more preferably 150 or more, further preferably 250 or more, particularly preferably 500 or more, extremely preferably 600 or more, and highly preferably 650 or more, from the viewpoint of easily obtaining excellent dispersion stability of the abrasive grains. From these viewpoints, the hydroxyl value of the specific hydroxy acid is more preferably 50 to 1500. Incidentally, the "hydroxyl value" is a numerical value which serves as a measure of the number of hydroxyl groups contained in the hydroxy acid, and is calculated from equation (1) below.

$$\text{Hydroxyl value} = 56110 \times \text{Number of hydroxyl groups} / \text{Molecular weight} \quad (1)$$

The lower limit of the content of the specific hydroxy acid is preferably 0.01% by mass or more, more preferably 0.03% by mass or more, further preferably 0.05% by mass or more, particularly preferably 0.08% by mass or more, and extremely preferably 0.1% by mass or more, on the basis of the total mass of the polishing liquid, from the viewpoint of easily obtaining excellent dispersion stability of the abrasive grains. The upper limit of the content of the specific hydroxy acid is preferably 1.0% by mass or less, more preferably 0.8% by mass or less, further preferably 0.5% by mass or less, particularly preferably 0.4% by mass or less, extremely preferably 0.3% by mass or less, and highly preferably 0.2% by mass or less, on the basis of the total mass of the polishing liquid, from the viewpoint of easily obtaining a suitable polishing rate for an insulating material. From these viewpoints, the content of the specific hydroxy acid is more preferably 0.01 to 1.0% by mass on the basis of the total mass of the polishing liquid.

The lower limit of the content of the specific hydroxy acid is preferably 10 parts by mass or more, more preferably 20 parts by mass or more, further preferably 30 parts by mass or more, particularly preferably 40 parts by mass or more, extremely preferably more than 40 parts by mass, highly preferably 50 parts by mass or more, and even more preferably 55 parts by mass or more, with respect to 100 parts by mass of the abrasive grains, from the viewpoint of easily obtaining excellent dispersion stability of the abrasive grains. The upper limit of the content of the specific hydroxy acid is preferably 100 parts by mass or less, more preferably less than 100 parts by mass, further preferably 80 parts by mass or less, particularly preferably 70 parts by mass or less, extremely preferably 65 parts by mass or less, and highly preferably 60 parts by mass or less, with respect to 100 parts by mass of the abrasive grains, from the viewpoint of easily obtaining a suitable polishing rate for an insulating material. From these viewpoints, the content of the specific hydroxy acid is more preferably 10 to 100 parts by mass with respect to 100 parts by mass of the abrasive grains.

The polishing liquid of the present embodiment may contain a hydroxy acid other than the specific hydroxy acid. Examples of such a hydroxy acid include a hydroxy acid having two or more carboxyl groups and a hydroxy acid having four or more hydroxyl groups. Specific examples thereof include glucuronic acid, gluconic acid, citric acid, and tartaric acid.

The lower limit of the content of the specific hydroxy acid in the polishing liquid of the present embodiment is preferably 50% by mass or more, more preferably 70% by mass or more, further preferably 90% by mass or more, particularly preferably 95% by mass or more, extremely preferably 97% by mass or more, and highly preferably 99% by mass or more, on the basis of the total mass of a hydroxy acid contained in the polishing liquid, from the viewpoint of easily obtaining excellent dispersion stability of the abrasive grains.

[Polyol]

The polishing liquid of the present embodiment contains a polyol (excluding a compound corresponding to a hydroxy acid) as an essential additive. The polyol is a compound having two or more hydroxy groups in the molecule.

Examples of the polyol include polyglycerin, polyvinyl alcohol, polyalkylene glycol (polyethylene glycol or the like), polyoxyalkylene glycol, polyoxyalkylene sorbitol ether (polyoxypropylene sorbitol ether or the like), a polyoxyalkylene condensate of ethylenediamine (ethylene diamine tetrapolyoxyethylene polyoxypropylene or the like), 2,2-bis(4-polyoxyalkylene-oxyphenyl)propane, polyoxyalkylene glyceryl ether, polyoxyalkylene diglyceryl ether, polyoxyalkylene trimethylolpropane ether, polyoxyalkylene pentaerythritol ether, and polyoxyalkylene methyl glucoside.

The polyol preferably contains at least one selected from the group consisting of polyglycerin, polyalkylene glycol, polyoxyalkylene glycol, polyoxyalkylene sorbitol ether, polyoxyalkylene glyceryl ether, polyoxyalkylene trimethylolpropane ether (polyoxyethylene trimethylolpropane ether or the like), and polyoxyalkylene pentaerythritol ether, and more preferably contains polyoxyalkylene trimethylolpropane ether, from the viewpoint of easily obtaining excellent dispersion stability of the abrasive grains. The polyol preferably contains a polyol not having an aromatic group from the viewpoint of easily obtaining excellent dispersion stability of the abrasive grains.

The polyol is preferably polyether polyol (a polyol having a polyether structure) from the viewpoint that it is easy to form a protective layer on a surface to be polished to moderately adjust the polishing rate, and thus, excessive polishing of the concave portion is easily suppressed, and therefore, it is easy to flatly finish a wafer after polishing.

The polyether polyol preferably has a polyoxyalkylene structure. According to this, it is easier to form a protective layer on a surface to be polished to moderately adjust the polishing rate, and thus, excessive polishing of the concave portion is more easily suppressed, and therefore, it is easier to flatly finish a wafer after polishing. The number of carbon atoms of the oxyalkylene group (structural unit) in the polyoxyalkylene structure is preferably 1 or more, and more preferably 2 or more, from the viewpoint of easily obtaining excellent dispersion stability of the abrasive grains. The number of carbon atoms of the oxyalkylene group (structural unit) in the polyoxyalkylene structure is preferably 5 or less, more preferably 4 or less, and further preferably 3 or less, from the viewpoint of easily obtaining excellent dispersion stability of the abrasive grains. From these viewpoints, the number of carbon atoms is preferably 1 to 5. The polyoxyalkylene chain may be a homopolymer chain and it may be a copolymer chain. The copolymer chain may be a block polymer chain and it may be a random polymer chain.

The polyol can be used singly or in combination of two or more kinds thereof.

The lower limit of the molecular weight of the polyol is preferably 100 or more, more preferably 200 or more, further preferably 300 or more, particularly preferably 330 or more, and extremely preferably 350 or more, from the viewpoint of easily obtaining excellent dispersion stability of the abrasive grains. The upper limit of the molecular weight of the polyol is preferably 5000 or less, more preferably 4000 or less, further preferably 3000 or less, particularly preferably 1000 or less, extremely preferably 800 or less, highly preferably 500 or less, and even more preferably 400 or less, from the viewpoint of easily obtaining excellent dispersion stability of the abrasive grains. From these viewpoints, the molecular weight of the polyol is more preferably 100 to 5000.

The lower limit of the content of the polyol is preferably 0.05% by mass or more, more preferably 0.1% by mass or more, further preferably 0.2% by mass or more, particularly preferably 0.3% by mass or more, extremely preferably 0.4% by mass or more, and highly preferably 0.5% by mass or more, on the basis of the total mass of the polishing liquid, from the viewpoint of easily obtaining excellent dispersion stability of the abrasive grains and from the viewpoint of further improving flatness. The upper limit of the content of the polyol is preferably 5.0% by mass or less, more preferably 3.0% by mass or less, further preferably 2.0% by mass or less, and particularly preferably 1.0% by mass or less, on the basis of the total mass of the polishing liquid, from the viewpoint of easily obtaining a suitable polishing rate for an insulating material. From these viewpoints, the content of the polyol is more preferably 0.05 to 5.0% by mass.

[Arbitrary Additive]

The polishing liquid of the present embodiment may further contain an arbitrary additive (excluding compound corresponding to the hydroxy acid and compound corresponding to the polyol). Examples of the arbitrary additive include amino acids, water-soluble polymers, and oxidants (for example, hydrogen peroxide). Each of these additives can be used singly or in combination of two or more kinds thereof.

The amino acid has the effect of stabilizing the pH of the polishing liquid, the effect of easily obtaining excellent dispersion stability of the abrasive grains, and the effect of further improving the polishing rate for an insulating material. Examples of the amino acid include arginine, lysine, aspartic acid, glutamic acid, asparagine, glutamine, histidine, proline, tryptophan, glycine, α-alanine, β-alanine, methionine, cysteine, phenylalanine, leucine, valine, isoleucine, glycylglycine, and glycylalanine.

The water-soluble polymer has the effect of adjusting polishing properties such as flatness, in-plane uniformity, the polishing selectivity of silicon oxide with respect to silicon nitride (the polishing rate for silicon oxide/the polishing rate for silicon nitride), and the polishing selectivity of silicon oxide with respect to polysilicon (the polishing rate for silicon oxide/the polishing rate for polysilicon). Here, the "water-soluble polymer" is defined as a polymer which is dissolved in 100 g of water in an amount of 0.1 g or more.

The water-soluble polymer is not particularly limited, and examples thereof include polyacrylic acid-based polymers such as polyacrylic acid, a polyacrylic acid copolymer, polyacrylate, and a polyacrylic acid copolymer salt; polymethacrylic acid-based polymers such as polymethacrylic acid and polymethacrylate; polyacrylamide; polydimethylacrylamide; polysaccharides such as alginic acid, pectinic acid, carboxymethylcellulose, agar, curdlan, dextrin, cyclodextrin, and pullulan; and vinyl-based polymers such as polyvinylpyrrolidone and polyacrolein. The water-soluble polymer can be used singly or in combination of two or more kinds thereof.

In the case of using an amino acid or an oxidant, the content thereof is preferably 0.0001 to 10% by mass on the basis of the total mass of the polishing liquid, from the viewpoint of obtaining the addition effect of the additive while suppressing precipitation of the abrasive grains.

In the case of using a water-soluble polymer, the lower limit of the content of the water-soluble polymer is preferably 0.0001% by mass or more, more preferably 0.001% by mass or more, further preferably 0.01% by mass or more, on the basis of the total mass of the polishing liquid, from the viewpoint of obtaining the addition effect of the water-soluble polymer while suppressing precipitation of the abrasive grains. The upper limit of the content of the water-soluble polymer is preferably 10% by mass or less, more preferably 5% by mass or less, further preferably 1% by mass or less, and particularly preferably 0.5% by mass or less, on the basis of the total mass of the polishing liquid, from the viewpoint of obtaining the addition effect of the water-soluble polymer while suppressing precipitation of the abrasive grains.

(Liquid Medium)

The liquid medium in the polishing liquid of the present embodiment is not particularly limited, but is preferably water such as deionized water or ultrapure water. The content of the liquid medium may correspond to the remaining of the polishing liquid from which the contents of other constituent components are removed, and is not particularly limited.

(Properties of Polishing Liquid)

The lower limit of the pH of the polishing liquid of the present embodiment is preferably 2.0 or more, more preferably 2.5 or more, further preferably 3.0 or more, particularly preferably 3.2 or more, extremely preferably 3.5 or more, and highly preferably 4.0 or more, from the viewpoint of easily obtaining excellent dispersion stability of the abrasive grains. The upper limit of the pH is preferably 7.0 or less, more preferably 6.5 or less, further preferably 6.0 or less, and particularly preferably 5.0 or less, from the viewpoint of easily obtaining excellent dispersion stability of the abrasive grains. From these viewpoints, the pH of the polishing liquid is more preferably 2.0 to 7.0. The pH may be less than 3.0, may be 2.8 or less, and may be 2.5 or less. The pH of the polishing liquid is defined as the pH at a liquid temperature of 25° C.

The pH of the polishing liquid can be adjusted by an acid component such as an inorganic acid or an organic acid; an alkali component such as ammonia, sodium hydroxide, tetramethylammonium hydroxide (TMAH), imidazole, or alkanolamine; or the like. In order to stabilize the pH, a buffer may be added. A buffer solution (buffer-containing liquid) may be added as the buffer. Examples of such a buffer solution include an acetate buffer solution and a phthalate buffer solution.

The pH of the polishing liquid of the present embodiment can be measured by a pH meter (for example, Model No. PHL-40 manufactured by DKK-TOA CORPORATION). Specifically, for example, after performing 2-point calibration of the pH meter using a phthalate pH buffer solution (pH: 4.01) and a neutral phosphate pH buffer solution (pH: 6.86) as a standard buffer solution, an electrode of the pH meter is placed in the polishing liquid for 2 minutes or longer, and the value after stabilization is measured. The liquid temperature of both the standard buffer solution and the polishing liquid are set to 25° C.

The polishing liquid of the present embodiment may be stored as a one-pack type polishing liquid containing at least abrasive grains, the specific hydroxy acid, a polyol, and a liquid medium, or as a multi-pack type (for example, two-pack type) polishing liquid set containing constituent components of the polishing liquid divided into a slurry (first liquid) and an additive liquid (second liquid) such that the slurry and additive liquid are mixed to form the polishing liquid. The slurry contains, for example, at least abrasive grains and a liquid medium. The additive liquid contains, for example, at least the hydroxy acid, a polyol, and a liquid medium. Between the slurry and the additive liquid, the specific hydroxy acid, a polyol, an arbitrary additive, and a buffer are preferably contained in the additive liquid. Incidentally, the constituent components of the polishing liquid may be stored as a polishing liquid set divided into three or more liquids.

In the polishing liquid set, the slurry and the additive liquid are mixed immediately before polishing or during polishing to prepare the polishing liquid. Further, a one-pack type polishing liquid may be stored as a stock solution for a polishing liquid with a reduced liquid medium content and used by dilution with a liquid medium at the time of polishing. A multi-pack type polishing liquid set may be stored as a stock solution for a slurry and a stock solution for an additive liquid with reduced liquid medium contents, and used by dilution with a liquid medium at the time of polishing.

In the case of a one-pack type polishing liquid, as a method of supplying the polishing liquid onto a polishing platen, a method of supplying the polishing liquid by direct liquid conveyance; a method of conveying the stock solution for the polishing liquid and a liquid medium through separate tubings, merging them to mix, and then supplying; a method of mixing the stock solution for a polishing liquid and a liquid medium in advance and then supplying; and the like can be used.

In the case of storage as a multi-pack type polishing liquid set divided into a slurry and an additive liquid, the polishing rate can be adjusted by arbitrarily changing the composition of these liquids. In the case of performing polishing using a polishing liquid set, as a method of supplying the polishing liquid onto a polishing platen, the following method is mentioned. For example, a method of conveying the slurry and the additive liquid through separate tubings, merging these tubings to mix, and then supplying; a method of conveying the stock solution for a slurry, the stock solution for an additive liquid, and a liquid medium through separate tubings, merging them to mix, and then supplying; a method of mixing the slurry and the additive liquid in advance and supplying; a method of mixing the stock solution for a slurry, the stock solution for an additive liquid, and a liquid medium in advance and the supplying; and the like can be used. Further, a method of respectively supplying the slurry and the additive liquid of the polishing liquid set onto a polishing platen can also be used. In this case, the polishing liquid obtained by mixing the slurry and the additive liquid on the polishing platen is used for polishing a surface to be polished.

The polishing liquid set of the present embodiment may be an aspect in which the polishing liquid containing at least the above-described essential component and the additive liquid containing at least an arbitrary component such as an oxidant (for example, hydrogen peroxide) are separated. In this case, a liquid mixture (this liquid mixture also corresponds to "polishing liquid") obtained by mixing the polishing liquid and the additive liquid is used to perform polishing. Further, the polishing liquid set of the present embodiment may be an aspect in which a liquid containing at least a part of the above-described essential component, a liquid containing at least the remainder of the above-described essential component, and the additive liquid containing at least an arbitrary component are separated, as the polishing liquid set separated into three or more liquids. Each of the liquids constituting the polishing liquid set may be stored as a stock solution with a reduced content of a liquid medium.

<Polishing Method>

The polishing method of the present embodiment (a polishing method for a base substrate, or the like) may include a polishing step of polishing a surface to be polished (a surface to be polished of the base substrate, or the like) by using the one-pack type polishing liquid or a polishing step of polishing a surface to be polished (a surface to be polished of the base substrate, or the like) by using a polishing liquid obtained by mixing the slurry and the additive liquid of the polishing liquid set.

The polishing method of the present embodiment may be a polishing method for a base substrate having an insulating material and silicon nitride, and may include, for example, a polishing step of selectively polishing the insulating material with respect to silicon nitride by using the one-pack type polishing liquid or a polishing liquid obtained by mixing the slurry and the additive liquid of the polishing liquid set. In this case, the base substrate may have, for example, a member containing an insulating material and a member containing silicon nitride.

Further, the polishing method of the present embodiment may be a polishing method for a base substrate having an insulating material and polysilicon, and may include, for example, a polishing step of selectively polishing the insulating material with respect to polysilicon by using the one-pack type polishing liquid or a polishing liquid obtained by mixing the slurry and the additive liquid of the polishing liquid set. In this case, the base substrate may have, for example, a member containing an insulating material and a member containing polysilicon.

The polishing method of the present embodiment may be a polishing method for a base substrate having a first member containing a stopper material; and a second member containing an insulating material and also disposed on the first member. The polishing step may include a step of polishing the second member by using the one-pack type polishing liquid or a polishing liquid obtained by mixing the slurry and the additive liquid of the polishing liquid set, until the first member is exposed. The polishing step may include a step of polishing the first member and the second member by using the one-pack type polishing liquid or a polishing liquid obtained by mixing the slurry and the additive liquid of the polishing liquid set, after the first member is exposed.

The expression "selectively polishing a material A with respect to a material B" means that the polishing rate for the material A is higher than the polishing rate for the material B under the same conditions. More specifically, the above expression means, for example, that the material A is polished with a polishing rate ratio of the polishing rate for the material A to the polishing rate for the material B being 80 or more.

In the polishing step, for example, in a state where a material to be polished of the base substrate that has the material to be polished is pressed against a polishing pad (polishing cloth) of a polishing platen, the polishing liquid is supplied between the material to be polished and the polishing pad, and the base substrate and the polishing platen are moved relative to each other to polish the surface to be polished of the material to be polished. In the polishing step, for example, at least a part of a material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of a material to be polished include an insulating material (excluding a material corresponding to a stopper material) such as silicon oxide; and a stopper material such as polysilicon or silicon nitride. A material to be polished may be a single material or a plurality of materials. In a case where a plurality of materials are exposed on a surface to be polished, they can be considered as a material to be polished. A material to be polished may be in the form of a film (film to be polished) or may be a silicon oxide film, a polysilicon film, a silicon nitride film, or the like.

By polishing a material to be polished (for example, an insulating material such as silicon oxide) formed on such a substrate with the polishing liquid and removing an excess part, it is possible to eliminate irregularities on the surface of a material to be polished and to produce a smooth surface over the entire surface of the polished material. The polishing liquid of the present embodiment is preferably used for polishing a surface to be polished containing silicon oxide.

In the present embodiment, it is possible to polish an insulating material of a base substrate having an insulating material containing silicon oxide on at least the surface, a stopper (polishing stop layer) disposed as an underlayer of the insulating material, and a substrate (semiconductor substrate or the like) disposed under the stopper. The stopper material constituting the stopper is a material having a lower polishing rate than that for insulating material, and is preferably polysilicon, silicon nitride, or the like. In such a base substrate, by stopping polishing when the stopper is exposed, it is possible to prevent the insulating material from being excessively polished, and thus flatness of the insulating material after polishing can be improved.

Examples of a method for forming a material to be polished by the polishing liquid of the present embodiment include a CVD method such as a low-pressure CVD method, a normal-pressure CVD method, or a plasma CVD method; and a rotation application method in which a liquid raw material is applied to a rotating substrate.

Hereinafter, the polishing method of the present embodiment will be described by taking a polishing method for a base substrate (for example, a base substrate having an insulating material formed on a semiconductor substrate) as an example. In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, a polishing apparatus: Reflexion manufactured by Applied Materials, Inc. can be used.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, at least one selected from the group consisting of foamed polyurethane and unfoamed polyurethane is preferable from the viewpoint of being further excellent in polishing rate and flatness. It is preferable that the polishing pad is subjected to grooving so that the polishing liquid is pooled.

Polishing conditions are not particularly limited, but the upper limit of the rotation speed of a polishing platen is preferably 200 min' or less such that the base substrate is not let out, and the upper limit of the polishing pressure to be applied to the base substrate (processing load) is preferably 15 psi (103 kPa) or less from the viewpoint of sufficiently suppressing the generation of polishing scratches. The polishing liquid is preferably continuously supplied to the polishing pad with a pump or the like during polishing. The amount supplied for this is not particularly limited, but it is preferable that the surface of the polishing pad is always covered with the polishing liquid.

The base substrate after the completion of polishing is preferably thoroughly washed in flowing water to remove the particles adhering to the base substrate. For the washing, dilute hydrofluoric acid or ammonia water may be concurrently used in addition to pure water, and a brush may be concurrently used to increase the washing efficiency. Further, it is preferable that, after washing, the water droplets adhering to the base substrate are removed off using a spin dryer or the like, and then the base substrate is dried.

The polishing liquid, the polishing liquid set, and the polishing method of the present embodiment can be suitably used in formation of an STI. For the formation of the STI, the lower limit of the polishing rate ratio of the insulating material (for example, silicon oxide) to the stopper material (for example, silicon nitride and polysilicon) is preferably 80 or more. When the polishing rate ratio is less than 80, the magnitude of the polishing rate for an insulating material with respect to the polishing rate for the stopper material is small, and thus, it will tend to be difficult to stop polishing at a predetermined position during formation of the STI. On the other hand, when the polishing rate ratio is 80 or more, it will be easier to stop polishing, which is further suitable for STI formation. The lower limit of the polishing rate for an insulating material (for example, silicon oxide) is preferably 70 nm/min or more, more preferably 100 nm/min or more, further preferably 150 nm/min or more, particularly preferably 180 nm/min or more, and extremely preferably 200 nm/min or more. The upper limit of the polishing rate for the stopper material (for example, silicon nitride and polysilicon) is preferably 10 nm/min or less, more preferably 7 nm/min or less, and further preferably 5 nm/min or less.

The polishing liquid, the polishing liquid set, and the polishing method of the present embodiment can also be used in polishing of a pre-metal insulating material. As the pre-metal insulating material, in addition to silicon oxide, for example, phosphorus-silicate glass or boron-phosphorus-silicate glass is used, and further, silicon oxyfluoride, fluorinated amorphous carbon, and the like can also be used.

The polishing liquid, the polishing liquid set, and the polishing method of the present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic conductive materials such as ITO; and polymer resin materials such as polyimide-based, polybenzooxazole-based, acrylic, epoxy-based, and phenol-based materials.

The polishing liquid, the polishing liquid set, and the polishing method of the present embodiment can also be applied not only to film-like materials to be polished, but also to various types of substrates made of glass, silicon, SiC, SiGe, Ge, GaN, GaP, GaAs, sapphire, plastics, and the like.

The polishing liquid, the polishing liquid set, and the polishing method of the present embodiment can be used not only for production of semiconductor elements, but also for production of image display devices such as TFTs and organic ELs; optical parts such as photomasks, lenses, prisms, optical fibers, and single crystal scintillators; optical elements such as optical switching elements and optical waveguides; light-emitting elements such as solid lasers and blue laser LEDs; magnetic storage devices such as magnetic disks and magnetic heads; and the like.

EXAMPLES

Hereinafter, the present invention will be described in detail by means of Examples. However, the present invention is not limited to the following Examples.

Examples 1 to 5 and Comparative Examples 1 to 4

<Preparation of Ceria Powder>

40 kg of commercially available cerium carbonate hydrate was placed in an alumina container and fired at 830° C. for 2 hours in air to obtain 20 kg of yellowish-white powder. This powder was subjected to phase identification by an X-ray diffraction method and it was confirmed that ceria powder was obtained. 20 kg of ceria powder thus obtained was subjected to dry pulverization using a jet mill to obtain ceria powder containing ceria particles.

<Preparation of Polishing Liquid for CMP>

After mixing the ceria powder (ceria particles) which was prepared as mentioned above with deionized water, a polyol (trade name: TMP-60 manufactured by NIPPON NYUKAZAI CO., LTD., polyoxyethylene trimethylolpropane) and a hydroxy acid shown in Table 1 or Table 2 were added. Then, dispersion under ultrasonication was performed while stirring to obtain a polishing liquid for CMP containing 0.18% by mass of the ceria particles, 0.50% by mass of the polyol, and 0.10% by mass of the hydroxy acid on the basis of the total mass of the polishing liquid for CMP. The dispersion under ultrasonication was performed at an ultrasonic wave frequency of 400 kHz for a dispersion time of 30 minutes.

Example 6

<Preparation of Ceria Slurry>

Ceria particles (first particles) and trade name; ammonium dihydrogen phosphate (molecular weight: 97.99) manufactured by Wako Pure Chemical Industries, Ltd. were mixed to prepare a ceria slurry (pH: 7) containing 5.0% by mass (solid content) of ceria particles. The blending amount of the ammonium dihydrogen phosphate was adjusted to 1% by mass on the basis of the total amount of ceria particles.

An adequate amount of the ceria slurry was charged into trade name: MICROTRAC MT3300EXII manufactured by MicrotracBEL Corp., and the average particle diameter of the ceria particles was measured. The displayed average particle diameter value was obtained as the average particle diameter (average secondary particle diameter). The average particle diameter of ceria particles in the ceria slurry was 350 nm.

An adequate amount of the ceria slurry was charged into trade name: DelsaNano C manufactured by Beckman Coulter, Inc., and measurement was performed twice at 25° C. The average value of the displayed zeta potential was obtained as the zeta potential. The zeta potential of the ceria particles in the ceria slurry was −55 mV.

<Preparation of Cerium Hydroxide Slurry>

(Synthesis of Cerium Hydroxide)

480 g of an aqueous 50% by mass $Ce(NH_4)_2(NO_3)_6$ solution (trade name: CAN50 liquid manufactured by Nihon Kagaku Sangyo Co., Ltd.) was mixed with 7450 g of pure water to obtain a solution. Next, while stirring this solution, 750 g of an aqueous imidazole solution (10% by mass aqueous solution, 1.47 mol/L) was added dropwise at a mixing rate of 5 mL/min to obtain a precipitate containing cerium hydroxide. The cerium hydroxide was synthesized at a temperature of 20° C. and a stirring speed of 500 $min^{-1}$. The stirring was carried out using a 3-blade pitch paddle with a total blade section length of 5 cm.

The obtained precipitate (precipitate containing cerium hydroxide) was subjected to centrifugal separation (4000 $min^{-1}$, for 5 minutes), and then subjected to solid-liquid separation with removal of a liquid phase by decantation. 10 g of particles obtained by solid-liquid separation and 990 g of water were mixed, and then the particles were dispersed in the water by using an ultrasonic cleaner to prepare a cerium hydroxide slurry (content of particles: 1.0% by mass) containing cerium hydroxide particles (second particles).

(Measurement of Average Particle Diameter)

When the average particle diameter (average secondary particle diameter) of the cerium hydroxide particles in the cerium hydroxide slurry was measured using trade name: N5 manufactured by Beckman Coulter, Inc., a value of 10 nm was obtained. The measuring method was as follows. First, about 1 mL of a measuring sample (cerium hydroxide slurry, aqueous dispersion) containing 1.0% by mass of cerium hydroxide particles was poured in a 1-cm square cell, and then the cell was set in the N5. Measurement was performed at 25° C. with the refractive index set to 1.333 and the viscosity set to 0.887 mPa·s as the measuring sample information of N5 software, and the value displayed as Unimodal Size Mean was read off (Measurement of Zeta Potential)

An adequate amount of the cerium hydroxide slurry was charged into trade name: DelsaNano C manufactured by Beckman Coulter, Inc. and measurement was performed twice at 25° C. The average value of the displayed zeta potentials was obtained as the zeta potential. The zeta potential of cerium hydroxide particles in the cerium hydroxide slurry was +50 mV.

(Structural Analysis of Cerium Hydroxide Particles)

An adequate amount of the cerium hydroxide slurry was taken and vacuum dried to isolate the cerium hydroxide particles, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Further, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Further, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

<Preparation of Polishing Liquid for CMP>

While stirring at a rotation speed of 300 rpm using a stirring blade of two blades, 32 g of the cerium hydroxide slurry and 1904 g of deionized water were mixed to obtain a liquid mixture. Further, after mixing 64 g of the ceria slurry to the liquid mixture while stirring the liquid mixture, stirring was performed while being irradiated with ultrasonic waves using an ultrasonic cleaner (device name: US-105) manufactured by SND Co., Ltd. Further, a polyol (trade name: TMP-60 manufactured by NIPPON NYUKAZAI CO., LTD., polyoxyethylene trimethylolpropane), a hydroxy acid, and deionized water were mixed. Thereby, a polishing liquid for CMP containing 0.18% by mass of abrasive grains, 0.50% by mass of the polyol, and 0.10% by mass of the hydroxy acid on the basis of the total mass of the polishing liquid for CMP was obtained. As the abrasive grains, the polishing liquid for CMP contained cerium hydroxide particles (free particles) that were not in contact with the ceria particles, in addition to composite particles including the ceria particles and the cerium hydroxide particles that were in contact with the ceria particles, a mass ratio between the ceria particles and the cerium hydroxide particles was 10:1 (ceria: cerium hydroxide).

(Zeta Potential of Abrasive Grains)

An adequate amount of the polishing liquid for CMP was charged into trade name: DelsaNano C manufacture by Beckman Coulter, Inc. and measurement was performed twice at 25° C. The average value of the displayed zeta potentials was obtained as the zeta potential. The results are shown in Table 1 and Table 2.

(pH of Polishing Liquid for CMP)

The pH of the polishing liquid for CMP was evaluated under the following conditions. The results are shown in Table 1 and Table 2.

[pH]

Measurement Temperature: 25° C.

Measurement apparatus: Model No. PHL-40 manufactured by DKK-TOA CORPORATION

Measurement method: after performing 2-point calibration using a standard buffer solution (phthalate pH buffer solution, pH: 4.01 (25° C.); neutral phosphate pH buffer solution, pH: 6.86 (25° C.)), an electrode was placed in the polishing liquid for CMP for 2 minutes or longer, and pH after stabilization was measured with the measurement apparatus above.

<Evaluation of Dispersion Stability>

As for the evaluation of the dispersion stability (particle diameter stability), the particle diameters (MV: volume average particle diameters) of the abrasive grains in the polishing liquid for CMP before and after storing the polishing liquid for CMP were measured and a particle diameter change ratio was calculated. The particle diameter change ratio was calculated on the basis of equation below. The polishing liquid for CMP immediately after preparation was stored at 25° C. for 168 hours. The particle diameters before and after storing were measured using a laser diffraction/scattering particle size distribution measurement device (trade name: MICROTRAC MT3300EXII manufactured by MicrotracBEL Corp.). The results are shown in Table 1 and Table 2.

Particle diameter change ratio (%)=|Particle diameter after storing(nm)−Particle diameter before storing(nm)|/Particle diameter before storing(nm)×100

As for the polishing evaluation, the silicon oxide film was polished by using each of the polishing liquids for CMP before and after storing under the conditions described below, the polishing rate was then calculated, and the polishing rate change ratio was calculated. The polishing rate change ratio was calculated on the basis of equation below. The polishing liquid for CMP immediately after preparation was stored at 25° C. for 168 hours. The results are shown in Table 1 and Table 2.

Polishing rate change ratio (%)=|Polishing rate after storing (nm/min)−Polishing rate before storing (nm/min)|/Polishing rate before storing(nm/min)×100

[Polishing]

A ϕ200 mm silicon wafer on which a silicon oxide film is formed was set in a holder of a polishing apparatus (trade name: Reflexion manufactured by Applied Materials, Inc.) to which an adsorption pad for mounting a base substrate is attached. The holder was placed on a platen to which a porous urethane resin pad is attached such that the silicon oxide film was opposed to the pad. The base substrate was pressed against the pad at a polishing load of 20 kPa while supplying the polishing liquid for CMP onto the pad at an amount supplied of 200 mL/min. At this time, polishing was performed for 1 min by rotating the platen at 78 min$^{-1}$ and the holder at 98 min$^{-1}$. The wafer after polishing was thoroughly washed with pure water and dried. The polishing rate was obtained by measuring a change in the film thickness of the silicon oxide film before and after polishing using a light interference type film thickness measuring apparatus.

TABLE 1

| | | Example | | | | | |
|---|---|---|---|---|---|---|---|
| Item | | 1 | 2 | 3 | 4 | 5 | 6 |
| Abrasive grains | Type | Ceria particles | | | | | Composite particles |
| | Zeta potential (mV) | +50 | | | | | +55 |
| | Content (mass %) | 0.18 | | | | | |
| Polyol | Type | TMP-60 | | | | | |
| | Content (mass %) | 0.50 | | | | | |
| Hydroxy acid | Type | DL-lactic acid | 2,2-bis (Hydroxymethyl) propionic acid | 2,2-bis (Hydroxymethyl) butyric acid | N,N-bis (2-Hydroxyethyl) glycine | N-[2-Hydroxy-1,1-bis(hydroxymethyl) ethyl]glycine | 2,2-bis (Hydroxymethyl) butyric acid |
| | Number of hydroxyl groups | 1 | 2 | 2 | 2 | 3 | 2 |
| | Hydroxyl value | 623 | 837 | 757 | 688 | 939 | 757 |
| | Number of carboxyl groups | 1 | 1 | 1 | 1 | 1 | 1 |
| | Content (mass %) | 0.10 | | | | | |
| | pH | 2.5 | 3.1 | 3.1 | 4.5 | 4.4 | 3.0 |
| Dispersion stability | Storing time (hr) | 0  168 | 0  168 | 0  168 | 0  168 | 0  168 | 0  168 |
| | Particle diameter (nm) | 360  369 | 360  362 | 360  361 | 360  361 | 361  371 | 360  363 |
| | Change ratio (%) | 2.5 | 0.6 | 0.3 | 0.3 | 2.8 | 0.8 |
| Polishing evaluation | Storing time (hr) | 0  168 | 0  168 | 0  168 | 0  168 | 0  168 | 0  168 |
| | Polishing rate (nm/min) | 459  391 | 394  347 | 354  347 | 603  528 | 598  540 | 391  385 |
| | Change ratio (%) | 14.8 | 11.9 | 2.0 | 12.4 | 9.7 | 1.5 |

TABLE 2

| | | Comparative Example | | | |
|---|---|---|---|---|---|
| Item | | 1 | 2 | 3 | 4 |
| Abrasive grains | Type | Ceria particles | | | |
| | Zeta potential (mV) | +50 | | | |
| | Content (mass %) | 0.18 | | | |
| Polyol | Type | TMP-60 | | | |
| | Content (mass %) | 0.50 | | | |
| Hydroxy acid | Type | Glucuronic acid | Gluconic acid | Citric acid | Tartaric acid |
| | Number of hydroxyl groups | 4 | 5 | 1 | 2 |
| | Hydroxyl value | 1156 | 1431 | 292 | 748 |
| | Number of carboxyl groups | 1 | 1 | 3 | 2 |
| | Content (mass %) | 0.10 | | | |
| | pH | 2.5 | 2.7 | 2.4 | 2.3 |
| Dispersion stability | Storing time (hr) | 0  168 | 0  168 | 0  168 | 0  168 |
| | Particle diameter (nm) | 360  451 | 360  472 | 360  842 | 360  786 |
| | Change ratio (%) | 25.3 | 31.1 | 133.9 | 118.3 |
| Polishing evaluation | Storing time (hr) | 0  168 | 0  168 | 0  168 | 0  168 |
| | Polishing rate (nm/min) | 414  106 | 242  52 | 12  8 | 10  6 |
| | Change ratio (%) | 74.4 | 78.5 | 33.3 | 40.0 |

As shown in Table 1 and Table 2, it is confirmed that, by concurrently using abrasive grains having a positive zeta potential, a specific hydroxy acid, and a polyol, the dispersion stability of the abrasive grains in the polishing liquid containing a polyol can be improved.

The invention claimed is:

1. A polishing liquid comprising: abrasive grains; a hydroxy acid component; a polyol component; and a liquid medium, wherein
a zeta potential of the abrasive grains is positive, the abrasive grains comprise ceria, an average secondary particle diameter of the abrasive grains is 200 nm or more,
the hydroxy acid component comprises at least one selected from the group consisting of 2,2-bis(hydroxymethyl)propionic acid, 2,2-bis(hydroxymethyl)butyric acid, N,N-bis(2-hydroxyethyl)glycine, and N-[2-hydroxy-1,1-bis(hydroxymethyl)ethyl]glycine, and
the polyol component comprises at least one selected from the group consisting of polyglycerin, polyvinyl alcohol, polyoxyalkylene sorbitol ether, a polyoxyalkylene condensate of ethylenediamine, 2,2-bis(4-polyoxyalkylene-oxyphenyl)propane, polyoxyalkylene glyceryl ether, polyoxyalkylene diglyceryl ether, polyoxyalkylene trimethylolpropane ether, polyoxyalkylene pentaerythritol ether, and polyoxyalkylene methyl glucoside.

2. The polishing liquid according to claim 1, wherein the hydroxy acid component further comprises a compound having one carboxyl group and one hydroxyl group.

3. The polishing liquid according to claim 1, wherein a content of the hydroxy acid component is 0.01 to 1.0% by mass.

4. The polishing liquid according to claim 1, wherein a content of the polyol component is 0.05 to 5.0% by mass.

5. The polishing liquid according to claim 1, wherein the polishing liquid is used for polishing a surface to be polished containing silicon oxide.

6. A polishing liquid set comprising:
constituent components of the polishing liquid according to claim 1, separately stored as a first liquid and a second liquid, wherein
the first liquid comprises the abrasive grains and the liquid medium, and
the second liquid comprises the hydroxy acid component, the polyol component, and the liquid medium.

7. A polishing method comprising a step of polishing a surface to be polished by using a polishing liquid obtained by mixing the first liquid and the second liquid of the polishing liquid set according to claim 6.

8. A polishing method for a base substrate having an insulating material and silicon nitride, the method comprising:
a step of selectively polishing the insulating material with respect to the silicon nitride by using a polishing liquid obtained by mixing the first liquid and the second liquid of the polishing liquid set according to claim 6.

9. A polishing method for a base substrate having an insulating material and polysilicon, the method comprising:
a step of selectively polishing the insulating material with respect to the polysilicon by using a polishing liquid obtained by mixing the first liquid and the second liquid of the polishing liquid set according to claim 6.

10. A polishing method comprising a step of polishing a surface to be polished by using the polishing liquid according to claim 1.

11. A polishing method for a base substrate having an insulating material and silicon nitride, the method comprising:
a step of selectively polishing the insulating material with respect to the silicon nitride by using the polishing liquid according to claim 1.

12. A polishing method for a base substrate having an insulating material and polysilicon, the method comprising:
a step of selectively polishing the insulating material with respect to the polysilicon by using the polishing liquid according to claim 1.

13. The polishing liquid according to claim 1, wherein a content of the abrasive grains is 0.2% by mass or less.

14. The polishing liquid according to claim 1, wherein the polyol component comprises at least one selected from the group consisting of polyoxyalkylene sorbitol ether, polyoxyalkylene glyceryl ether, polyoxyalkylene trimethylolpropane ether, and polyoxyalkylene pentaerythritol ether.

15. The polishing liquid according to claim 1, wherein a content of the polyol component is 0.05% by mass or more.

16. The polishing liquid according to claim 1, wherein the polyol component comprises polyoxyalkylene trimethylolpropane ether.

17. The polishing liquid according to claim 1, the polyol component comprises at least one selected from the group consisting of polyoxyalkylene sorbitol ether, a polyoxyalkylene condensate of ethylenediamine, 2,2-bis(4-polyoxyalkylene-oxyphenyl)propane, polyoxyalkylene glyceryl ether, polyoxyalkylene diglyceryl ether, polyoxyalkylene trimethylolpropane ether, polyoxyalkylene pentaerythritol ether, and polyoxyalkylene methyl glucoside.

18. The polishing liquid according to claim 17, wherein the polyol component comprises polyoxyalkylene trimethylolpropane ether.

19. The polishing liquid according to claim 1, wherein the abrasive grains do not comprise silica.

* * * * *